United States Patent [19]

Dodd et al.

[11] 4,354,911

[45] Oct. 19, 1982

[54] METHOD OF SELECTIVELY DEPOSITING A METAL ON A SURFACE BY MEANS OF SPUTTERING

[75] Inventors: Thomas C. Dodd, Millstone Township, Somerset County; John A. Emerson, Alexandria Township, Hunterdon County, both of N.J.

[73] Assignee: Western Electric Company Inc., New York, N.Y.

[21] Appl. No.: 291,155

[22] Filed: Aug. 7, 1981

[51] Int. Cl.³ .............................................. C23C 15/00
[52] U.S. Cl. .............................. 204/192 EC; 427/304; 361/397
[58] Field of Search ................. 204/192 EC; 427/304; 361/397

[56] References Cited

U.S. PATENT DOCUMENTS

| 4,121,015 | 10/1978 | McPherson | 428/418 |
| 4,157,936 | 6/1979 | Piazza | 156/659 |
| 4,243,700 | 1/1981 | Piazza | 427/195 |

*Primary Examiner*—Arthur P. Demers
*Attorney, Agent, or Firm*—J. F. Spivak

[57] ABSTRACT

It has been discovered that by cleaning a substrate having a negative ink pattern of a desired circuit in a plasma comprising 60/40 oxygen/argon and then sputtering a thin (10–50 Angstroms) layer of catalytic copper thereover, the treated substrate when exposed to an electroless plating bath will selectively plate only in the areas where there is no ink.

20 Claims, No Drawings

METHOD OF SELECTIVELY DEPOSITING A METAL ON A SURFACE BY MEANS OF SPUTTERING

TECHNICAL FIELD

The present invention relates to a method of forming a selective metallic pattern on a substrate. More particularly, the invention relates to a method of making a printed circuit board by means of a metal sputtering technique followed by treatment in an electroless plating bath which results in selective electroless plating.

BACKGROUND OF THE INVENTION

Printed circuit boards prepared either from a copper clad laminate or from a laminate made by electroless plating followed by electroplating over a substrate followed by steps such as coating the laminate with a resist, exposure of the resist in accordance with a desired pattern, development, etching, etc., are well known in the art. Similarly, additive processes such as catalyzing a substrate in accordance with a desired pattern and then selectively electrolessly plating the catalyzed areas of the substrate in accordance with the desired pattern with copper generally followed by building up the copper layer by electroplating are also well known in the art. Still other known techniques include the vapor deposition of a metal on a substrate either in blanket form followed by selective etching by means of photoresist and the like or selectively vapor depositing a metal on the substrate through a mask are also known.

There has recently been a desire and a trend in the manufacture of printed circuit boards to avoid excessive etching; this is especially due to the environmental hazards of the acids generally used for etching as well as for waste materials formed as well as the loss of metal which is first deposited which must then be etched away. While the additive electroless plating processes avoid this problem, such plating processes have problems of their own with regard to the handling of the various plating solutions that must be employed as well as in the cost involved in the various applicable photoresist and imaging techniques. The inventors of the present invention have surprisingly and unexpectedly discovered a simple method for preparing a printed circuit board, or for that matter any metallic pattern on a substrate, by means of sputtering a desired catalytic metal on a surface having a pattern thereon formed from an ink in a manner so as to result in the selective deposition of a metal on the surface in accordance with the negative of the pattern when treated in an electroless plating solution.

SUMMARY OF THE INVENTION

In accordance with the present invention, a substrate is provided with a predetermined metallic pattern by first coating the substrate with an ink in accordance with the negative of the desired pattern and then cleaning the substrate in a vacuum in a plasma consisting of at least 60 percent oxygen followed by depositing a desired catalytic metallic coating by means of sputtering the catalytic metal onto the substrate in a plasma which also contains at least 60 percent oxygen together with an inert gas. It has unexpectedly been found that while the sputtered metal layer on a substrate treated in accordance with the above method, gives a blanket coat, when subsequently treated with an electroless plating solution, the electrolessly plated metal surprisingly only adheres to that portion of the substrate which has not been coated with the ink.

DETAILED DESCRIPTION

The invention will be described in terms of forming a printed circuit board in accordance with the novel method. It should be understood, however, that the invention can be used for forming any metallic pattern on a substrate for uses other than printed circuit boards.

In general, the invention comprises the steps of applying an ink, such as a strippable ink or thermographic printing ink onto the desired substrate such as a modified epoxy resin substrate. Preferably the substrate has been previously prepared, such as by etching techniques well known in the art, to enhance the adhesion of the ink to the substrate. The substrate is then generally baked so as to cure and set the ink on the substrate. The inks can be applied to the substrate by any of the well known techniques such as offset printing, screen printing, gravure printing and the like. The substrate containing the cured ink pattern thereon is then placed into a vacuum chamber containing 60 percent or more of oxygen, the balance being argon or other inert gas and a plasma is formed so as to clean the surface of the substrate in the plasma. After cleaning, a catalytic metal pattern is formed on the substrate by sputtering the desired metal, such as copper, by any of the well known sputtering techniques in a sputtering atmosphere consisting of at least 60 percent oxygen, the balance being argon or other inert gas. It has unexpectedly and surprisingly been found that when the substrate containing the ink is cleaned in a plasma containing at least 60 percent of oxygen and the copper or other catalytic metal is sputtered in such an atmosphere, the sputtered film forming on the substrate forms a blanket layer which is only catalytic to subsequent electroless plating in those areas which were not coated with the ink. Therefore, the ink provides a negative pattern on the substrate for the later formation of the desired electrolessly plated metallic pattern. It has been found that if the cleaning step is omitted or if the cleaning step employs a plasma not having at least 60 percent oxygen, either a nonselective catalytic blanket plating results (i.e., the desired pattern is not formed upon catalytic subsequent electroless plating) and/or the sputtered metal will have exceedingly poor adhesion to the substrate.

Examples of suitable strippable inks or thermographic printing inks can be found with reference to U.S. Pat. Nos. 4,157,936 and 4,243,700 issued to John Piazza and are incorporated herein by reference. Suitable substrates should include any of the well known substrates commonly employed for the manufacture of printed circuit boards as well as other materials. A preferred substrate material is a rubber-modified epoxy resin having a formulation made in accordance with U.S. Pat. No. 4,121,015 issued to C. A. McPherson which is incorporated herein by reference or any of the commercially available epoxy resins.

While it is believed that any metal which is catalytic to electroless deposition can be employed as the sputtered metal, copper is the preferred metal for use in the manufacture of printed boards especially since copper is the metal generally electrolessly deposited for the formation of the printed circuit boards. Another reason why copper is a preferred metal for both sputtering and deposition is its relative cost as compared with precious metals often used as catalytic metals for electroless plating. Applicable electroless plating solutions are any of those electroless plating solutions which are well known in the art and are commercially available. For example, any of the commercially available electroless plating solutions sold by Enthone Corporation, MacDermid or Shipley Corporation are suitable.

The general procedure in preparing a printed circuit board employing an epoxy surface is to first swell the surface such as by dipping the substrate in methylethyl ketone followed by etching the surface in a chromic acid etch solution. This surface preparation enhances the adhesion of subsequently deposited materials on the surface. The etched surface is tehn neutralized and rinsed. A negative image pattern is then applied to the surface such as by screen printing a suitable ink formulation over the surface and drying the ink by baking the substrate at a suitable temperature. The substrate is then placed in a vacuum chamber which is evacuated to about $10^{-5}$ torr and then backfilled with a mixture of 60 percent oxygen and 40 percent argon to a pressure of 2.5 microns. While in the chamber, an oxygen-argon plasma is formed and the substrate is cleaned in the plasma for about three minutes. Subsequent to cleaning, a voltage is applied across a copper cathode so as to sputter copper from the cathode and deposit it on the substrate. A blanket film of copper generally ranging from about 10 through 50 Angstroms in thickness is deposited on the substrate. The substrate is then removed from the vacuum chamber and treated with an electroless copper plating solution. Copper is electrolessly deposited selectively on the substrate in the areas which were not coated with the ink.

Some of the suitable ink formulations can be found with reference to the table given below.

EXAMPLE I

A swell etched epoxy substrate having a resist pattern thereon is cleaned in a plasma consisting of 60 percent oxygen and 40 percent argon at a pressure of three microns for a period of three minutes. The plasma is formed between a hot filament and cold anode under an applied voltage of 150 volts and with a current of five amperes. Subsequent to the cleaning step, copper is sputtered from a copper cathode, a third electrode, under a voltage of 400 volts and a current of 0.5 amperes for a period of 60 seconds at a rate of approximately 50 Angstroms per minute and in an atmosphere consisting of 60 percent oxygen and 40 percent argon at a pressure of three microns. A uniform blanket layer of copper is thus deposited over the substrate surface. The substrate is then removed from the vacuum chamber and placed in a commercially available electroless plating bath. After the elapse of a sufficient time, an electroless copper deposit forms selectively over those portions of the substrate which do not contain the ink. The sputtered copper therefor only catalyzes the electroless plating in those areas which are not masked with the resist or ink.

EXAMPLE II

The same procedure is followed as set forth in Example I except that after cleaning the substrate in the oxygen/argon plasma, the oxygen is purged from the system and the copper is sputtered at a pressure of three microns under essentially pure argon. It was found upon immersion in the electroless plating bath, that a blanket nonselective electroless deposit was quickly formed over the substrate. Thus, in the absence of oxygen during the sputtering of the copper, the resultant sputtered copper is catalytic toward the electroless plating bath over all regions of the substrate including the region over which the ink or resist was placed.

|  | 1 wt. parts | 2 wt. parts | 3 wt. parts | 4 wt. parts | 5 wt. parts | 6 wt. parts | 7 wt. parts | 8 wt. parts | 9 wt. parts | 10 wt. parts | 11 wt. parts | 12 wt. parts | 13 wt. parts | 14 wt. parts |
|---|---|---|---|---|---|---|---|---|---|---|---|---|---|---|
| DEN 431 | 100.0 | 100.0 | 100.0 | 100.0 | 100.0 | 100.0 | 100.0 | 100.0 | 100.0 |  |  | 100.0 | 100.0 | 100.0 |
| Anchor 1222 | 29.9 | 35.1 | 12.5 | 12.5 | 12.5 | 12.5 | 12.5 |  |  |  |  |  |  |  |
| Anchor 1040 |  |  |  |  |  |  |  | 10.0 |  |  |  |  |  | 10.0 |
| Anchor 1115 |  |  |  |  |  |  |  |  | 7.5 |  |  | 7.5 | 7.5 |  |
| Epon 828 |  |  |  |  |  |  |  |  |  | 100.0 | 100.0 |  |  |  |
| Epon 871 |  |  |  |  |  |  |  |  |  | 33.3 | 33.3 |  |  |  |
| Butte 65 |  |  |  |  |  |  |  |  |  | 33.3 | 33.3 |  |  |  |
| P-TSA |  |  |  |  |  |  |  |  |  |  | 1.6 |  |  |  |
| Raven 1255 |  |  |  |  |  |  | 25.0 | 25.0 | 25.0 | 41.6 | 40.0 |  |  |  |
| TiO$_2$ (R-900) |  |  |  |  |  |  |  |  |  |  |  | 15.0 |  |  |
| Imperial X3228 | 17.9 | 21.1 | 15.0 | 15.0 | 15.0 | 7.5 |  |  |  |  |  |  | 15.0 | 15.0 |
| Bentone 27 |  | 17.5 |  | 2.5 | 5.0 | 5.0 |  |  |  |  |  |  | 2.5 | 2.5 |
| FC 430 | 1.5 | 1.8 | 1.0 | 1.0 | 1.0 | 1.0 |  |  |  |  |  |  | 1.0 | 1.0 |

In addition to the ink compositions set forth in the table it should be understood that commercially available resist compositions are also suitable and included in the terminology ink as used herein.

The following examples illustrate the importance of the plasma cleaning and sputtering in a composition containing at least 60 percent oxygen and the balance in inert gas such as argon.

EXAMPLE III

The procedure set forth in Example I is repeated except that the cleaning step is completely eliminated. Sputtering is still accomplished in a 60 percent oxygen/40 percent argon atmosphere. It was found that in the absence of the cleaning step, upon immersion in the electroless plating bath, electrolessly deposited copper quickly coated the entire substrate in a nonselective manner and further there was some blistering of the copper deposit over the area in which the mask or ink was present. Hence, in the absence of the plasma cleaning step, selective plating is not achieved.

EXAMPLE IV

The same steps as set forth in Example I were followed except that the atmosphere employed for plasma cleaning and sputtering consisted of 45 percent oxygen and 55 percent argon rather than the 60 percent oxygen and 40 percent argon atmosphere as in Example I. In this instance, upon immersion in the electroless plating bath, nonselective plating resulted further, indicating the criticality of not only the need for oxygen but that oxygen must be present in a minimum amount such as 60 percent.

What is claimed is:

1. A method of selectively depositing a metallic pattern on a substrate including the steps of:
    coating the substrate with a suitable ink in accordance with the negative of the desired pattern;
    cleaning the negative patterned substrate in a plasma comprising at least 60% oxygen and an inert gas;
    sputtering a catalytic metal coating onto the substrate in a plasma comprising at least 60% oxygen and an inert gas; and
    electrolessly depositing a metallic coating on the substrate in accordance with the desired metallic pattern.

2. A method recited in claim 1 wherein the ink is a strippable ink or a thermographic printing ink.

3. The method recited in claim 1 wherein the substrate is treated prior to coating of the ink thereon so as to increase adhesion of the ink and catalytic metal to the substrate.

4. The method recited in claim 3 wherein the substrate comprises a rubber modified epoxy resin which is swelled and etched prior to coating with the ink.

5. The method recited in claim 1 wherein the inert gas is argon.

6. The method recited in clai 1 wherein both cleaning and sputtering is done in a plasma consisting essentially of 60% $O_2$ and 40% Ar.

7. The method recited in claims 1 and 6 wherein cleaning and sputtering are accomplished without breaking the vacuum.

8. The method recited in claim 1 wherein cleaning and sputtering are done in a vacuum of about 2.5 microns.

9. The method recited in multiple claim 7 wherein the sputtered catalytic metal is copper.

10. The method recited in claim 9 wherein the copper is sputtered to a thickness of from 10-50 Angstroms.

11. A method of making a printed circuit board comprises the steps of:
    coating a cleaned substrate with a suitable ink to define a negative of the desired circuit pattern;
    cleaning the negative patterned substrate in a plasma comprising 60% oxygen and an inert gas;
    sputtering a metal catalytic to electroless plating onto the plasma cleaned substrate in a plasma comprising at least 60% oxygen and an inert gas; and
    electrolessly depositing a metallic coating on the substrate in accordance with the desired circuit pattern.

12. The method recited in claim 11 wherein the ink is a strippable ink or a thermographic printing ink.

13. The method recited in claim 11 wherein the substrate is treated prior to coating of the ink thereon so as to increase adhesion of the ink and catalytic metal to the substrate.

14. The method recited in claim 13 wherein the substrate comprises a rubber modified epoxy resin which is swelled and etched prior to coating with the ink.

15. The method recited in claim 11 wherein the inert gas is argon.

16. The method recited in claim 11 wherein both cleaning and sputtering is done in a plasma consisting essentially of 60% $O_2$ and 40% Ar.

17. The method recited in claims 11 and 16 wherein cleaning and sputtering are accomplished without breaking the vacuum.

18. The method recited in claim 11 wherein cleaning and sputtering are done in a vacuum of about 2.5 microns.

19. The method recited in multiple claim 17 wherein the sputtered catalytic metal is copper.

20. The method recited in claim 11 including the step of stripping any exposed catalytic metal from the substrate subsequent to electroless deposition.

* * * * *